United States Patent
Buschel et al.

(10) Patent No.: US 9,296,056 B2
(45) Date of Patent: Mar. 29, 2016

(54) DEVICE FOR THERMAL MANAGEMENT OF SURFACE MOUNT DEVICES DURING REFLOW SOLDERING

(71) Applicant: International Business Machines Corporation, Armonk, NY (US)

(72) Inventors: Daniel James Buschel, Poughkeepsie, NY (US); Michael J Fisher, Poughkeepsie, NY (US); James Edward Tersigni, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/326,287

(22) Filed: Jul. 8, 2014

(65) Prior Publication Data

US 2016/0008904 A1    Jan. 14, 2016

(51) Int. Cl.
*B23K 31/02* (2006.01)
*B23K 37/00* (2006.01)
*B23K 3/08* (2006.01)
*B23K 1/00* (2006.01)
*H05K 3/30* (2006.01)

(52) U.S. Cl.
CPC .............. *B23K 3/085* (2013.01); *B23K 1/0016* (2013.01); *H05K 3/303* (2013.01); *H05K 2203/0195* (2013.01); *H05K 2203/04* (2013.01)

(58) Field of Classification Search
None
See application file for complete search history.

(56) References Cited

U.S. PATENT DOCUMENTS

| | | | | |
|---|---|---|---|---|
| 3,614,832 A | * | 10/1971 | Chance et al. | 29/831 |
| 3,616,984 A | | 11/1971 | Voroba | |
| 3,657,508 A | * | 4/1972 | Studnick | 219/85.13 |
| 4,717,064 A | | 1/1988 | Popielarski et al. | |
| 4,725,716 A | | 2/1988 | Entwistle et al. | |
| 4,858,820 A | * | 8/1989 | Kent | 228/264 |
| 5,128,506 A | | 7/1992 | Dahne et al. | |
| 5,441,195 A | * | 8/1995 | Tustaniwskyj et al. | 228/180.22 |
| 5,617,990 A | * | 4/1997 | Thompson, Sr. | 228/180.1 |
| 5,632,434 A | * | 5/1997 | Evans et al. | 228/44.7 |
| 5,641,112 A | * | 6/1997 | Moradi et al. | 228/49.5 |
| 5,641,114 A | * | 6/1997 | Horton et al. | 228/222 |
| 5,699,610 A | * | 12/1997 | Shimada et al. | 29/840 |
| 5,785,233 A | | 7/1998 | Nutter et al. | |
| 5,820,013 A | * | 10/1998 | Ortiz | 228/43 |

(Continued)

FOREIGN PATENT DOCUMENTS

| | | |
|---|---|---|
| CN | 103190206 A | 7/2013 |
| EP | 0169885 B1 | 7/1990 |

(Continued)

*Primary Examiner* — Kiley Stoner
(74) *Attorney, Agent, or Firm* — Kunzler Law Group; Damion Josephs

(57) ABSTRACT

An apparatus includes a top plate sized to cover components for a PCB in a solder operation to attach the components to a top surface of the PCB. The apparatus may include heat shielding devices and/or heat attracting devices. Each heat shielding device reduces heat transfer to a component to be soldered to the PCB and is positioned in the top plate to decrease heat to the component corresponding to the heat shielding device. Each heat attracting device increases heat transfer to a component to be soldered to the PCB and each heat attracting device is positioned in the top plate to increase heat to the component under the heat attracting device. The top plate is coupled to the heat shielding and/or heat attracting devices and includes a recess for each component configured with a heat shielding device or a heat attracting device.

18 Claims, 4 Drawing Sheets

(56) References Cited

U.S. PATENT DOCUMENTS

| | | | |
|---|---|---|---|
| 5,984,165 A * | 11/1999 | Inoue et al. | 228/180.22 |
| 6,123,247 A * | 9/2000 | Shibo et al. | 228/46 |
| 6,135,344 A | 10/2000 | Sakuyama et al. | |
| 6,142,357 A * | 11/2000 | Howell | 228/39 |
| 6,202,916 B1 * | 3/2001 | Updike et al. | 228/180.1 |
| 6,281,449 B1 * | 8/2001 | Nakamura et al. | 174/261 |
| 6,354,844 B1 * | 3/2002 | Coico et al. | 439/66 |
| 6,402,011 B1 | 6/2002 | Taniguchi et al. | |
| 6,768,083 B2 | 7/2004 | Rae et al. | |
| 7,657,998 B2 * | 2/2010 | Tanaka | 29/840 |
| 8,104,666 B1 * | 1/2012 | Hwang et al. | 228/180.22 |
| 2003/0102297 A1 * | 6/2003 | Goenka et al. | 219/400 |
| 2003/0111518 A1 * | 6/2003 | Dances | 228/215 |
| 2004/0134975 A1 * | 7/2004 | Goenka et al. | 228/248.1 |
| 2005/0001019 A1 * | 1/2005 | Goenka et al. | 228/233.2 |
| 2005/0133934 A1 * | 6/2005 | Mellody et al. | 257/779 |
| 2006/0102703 A1 * | 5/2006 | Akhtar et al. | 228/260 |
| 2007/0251981 A1 * | 11/2007 | Chapman et al. | 228/214 |
| 2008/0013277 A1 * | 1/2008 | Ueda et al. | 361/696 |
| 2009/0134205 A1 * | 5/2009 | Kimbara | 228/180.21 |
| 2011/0064363 A1 * | 3/2011 | Steijer et al. | 385/88 |
| 2011/0083836 A1 * | 4/2011 | Kobayashi | 165/185 |
| 2012/0319253 A1 * | 12/2012 | Mizuno | 257/659 |
| 2014/0001243 A1 * | 1/2014 | Alvarez et al. | 228/248.1 |
| 2014/0063748 A1 * | 3/2014 | Kraft et al. | 361/720 |
| 2014/0378072 A1 * | 12/2014 | Waldvogel et al. | 455/73 |
| 2015/0041525 A1 * | 2/2015 | Tanimoto et al. | 228/252 |

FOREIGN PATENT DOCUMENTS

| | | | | |
|---|---|---|---|---|
| JP | 2003110232 A | * | 4/2003 | H05K 3/34 |
| WO | 8503248 | | 8/1985 | |
| WO | WO 2013161892 A1 | * | 10/2013 | |

* cited by examiner

DEVICE FOR THERMAL MANAGEMENT OF SURFACE MOUNT DEVICES DURING REFLOW SOLDERING

FIELD

The subject matter disclosed herein relates to soldering and more particularly relates to adjusting heating of certain components during a soldering operation.

BACKGROUND

Electronic card assembly often involves placement of surface-mount devices ("SMDs") onto a printed circuit board ("PCB"). The surface mount devices are typically placed on sites on the PCB which have been coated with a solder paste. Once the surface mount devices are in place, the printed circuit board is typically heated to a point at which the solder paste becomes liquid (reflows) and then is allowed to cool. When the assembly is cool, the SMDs are affixed to the circuit board by means of the solder which provides electrical and mechanical connection. This method of circuit board manufacturing presents challenges due to the fact that differing SMDs require different process parameters, most notably different amounts of heat. Because SMDs of different design and configuration have varying thermal requirements and restriction, reflowing a circuit board with a mix of such components can be difficult and components may be damaged or may be improperly connected to the PCB. Additionally, as PCBs become more densely populated and as lead-free solder chemistry is used (thus requiring higher processing temperatures), the management of individual component temperature profiles becomes more critical.

BRIEF SUMMARY

A soldering apparatus is disclosed. A method for using the soldering apparatus is also disclosed. The soldering apparatus includes, in one embodiment, a top plate sized to cover a plurality of components for a printed circuit board ("PCB") in a solder operation, such as a reflow solder operation, to attach the plurality of components to a top surface of the PCB. The soldering apparatus may include one or more heat shielding devices. Each heat shielding device reduces heat transfer to a component to be soldered to the PCB during the solder operation and each heat shielding device is positioned in the top plate to decrease heat to the component corresponding to the heat shielding device. The soldering apparatus may also include one or more heat attracting devices. Each heat attracting device increases heat transfer to a component to be soldered to the PCB during the solder operation and each heat attracting device is positioned in the top plate to increase heat to the component corresponding to the heat attracting device. The soldering apparatus may include one or more heat shielding devices, one or more heat attracting devices, or a combination of heat shielding and heat attracting devices. In one embodiment, the top plate is coupled to the one or more heat shielding and heat attracting devices and the top plate includes a recess for each component of the plurality of components configured with a heat shielding device or a heat attracting device.

In one embodiment, each recess is sized with a depth so that a bottom of each of the plurality of components to be soldered to the PCB is parallel to the top surface of the PCB. In another embodiment, at least one recess in the top plate for a component extends through the top plate forming a hole in the top plate. In a related embodiment, a heat shielding device or a heat attracting device is coupled to the top plate over the hole. In another related embodiment, a heat shielding device or a heat attracting device contacts the component protruding through the top plate. In one embodiment, at least one recess in the top plate for a component extends partially through the top plate where a portion of the top plate extends over the component. In a related embodiment, a heat shielding device or a heat attracting device is coupled to the top plate over the recess to the portion of the top plate extending over the component.

In one embodiment, a heat shielding device includes a heat resistant material that resists heat transfer through the heat shielding device. In another embodiment, a heat shielding device includes a device shaped to direct heat away from an area under the heat shielding device. In another embodiment, a heat attracting device includes a material that conducts heat through the heat attracting device at a rate higher than heat transfer through material of the top plate. In another embodiment, a heat attracting device includes a device shaped to direct heat to an area under the heat attracting device.

In one embodiment, the top plate includes at least one opening positioned over one or more additional components where the opening is configured without a heat shielding device and without a heat attracting device. In a further embodiment, the opening is configured to allow access to an area of the PCB for placement of the additional components on the PCB prior to the solder operation. In one embodiment, the top plate includes one or more recesses for components without a heat shielding device and without a heat attracting device. In another embodiment, the top plate includes a plurality of openings surrounding the recesses for the plurality of components. In another embodiment, the top plate includes aluminum.

A method includes forming a top plate sized to cover a plurality of components to be soldered to a PCB in a solder operation, such as a reflow solder operation, to attach the plurality of components to a top surface of the PCB. The method may include connecting to the top plate to one or more heat shielding devices and/or one or more heat attracting devices. Each heat shielding device reduces heat transfer to a component to be soldered to the PCB during the reflow solder operation and each heat shielding device is positioned in the top plate to decrease heat to the component corresponding to the heat shielding device. Each heat attracting device increases heat transfer to a component to be soldered to the PCB during the reflow solder operation and each heat attracting device is positioned in the top plate to increase heat to the component corresponding to the heat attracting device. In one embodiment, the top plate includes a recess for each component of the plurality of components configured with a heat shielding device or a heat attracting device.

The method may also include placing the plurality of components in the recesses, where each component of the plurality of components is placed in the top plate with a side to be soldered to the PCB facing away from the top plate, and placing the PCB in contact with the plurality of components with a top side of the PCB facing the component. The method may include executing the reflow solder operation.

In one embodiment, the plurality of components are placed in the top plate while the top plate is positioned with the recesses facing up and the method also includes, prior to executing the reflow solder operation, rotating the top plate, components, and PCB so the PCB is below the top plate. In another embodiment, the method includes placing one or more additional components on the PCB through an opening in the PCB in response to rotating the top plate, components, and PCB and prior to executing the reflow solder operation.

Another soldering apparatus includes a top plate sized to cover a plurality of components for a PCB in a reflow solder operation to attach the plurality of components to a top surface of the PCB. The top plate includes at least one opening positioned over one or more additional components. The soldering apparatus includes one or more heat shielding devices, one or more heat attracting devices, or both. Each heat shielding device reduces heat transfer to a component to be soldered to the PCB during the reflow solder operation and each heat shielding device is positioned in the top plate to decrease heat to the component corresponding to the heat shielding device. Each heat attracting device increases heat transfer to a component to be soldered to the PCB during the reflow solder operation and each heat attracting device is positioned in the top plate to increase heat to the component corresponding to the heat attracting device.

At least one recess in the top plate for a component extends through the top plate forming a hole in the top plate and a heat shielding device or a heat attracting device contacts the component protruding through the top plate. In one embodiment, at least one recess in the top plate for a component extends partially through the top plate where a portion of the top plate extends over the component and a heat shielding device or a heat attracting device is coupled to the top plate over the recess to the portion of the top plate extending over the component. The opening in the top plate, in one embodiment, is configured without a heat shielding device and without a heat attracting device and the opening is configured to allow access to an area of the PCB for placement of the additional components on the PCB prior to the reflow solder operation. The top plate, in one embodiment, is coupled to the one or more heat shielding and heat attracting devices and the top plate includes a recess for each component of the plurality of components configured with a heat shielding device or a heat attracting device. Each recess is sized with a depth so that a bottom of each of the plurality of components to be soldered to the PCB is parallel to the top surface of the PCB.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

Figure 1A:
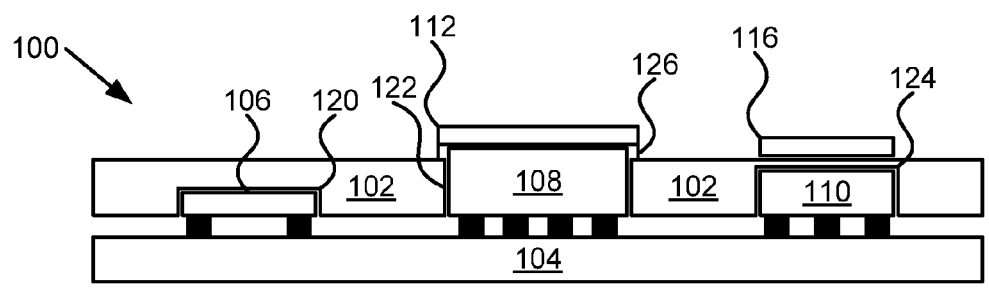
FIG. 1A is a schematic block diagram illustrating a section view of one embodiment of a solder apparatus in accordance with one embodiment of the present invention.
Figure 1B:
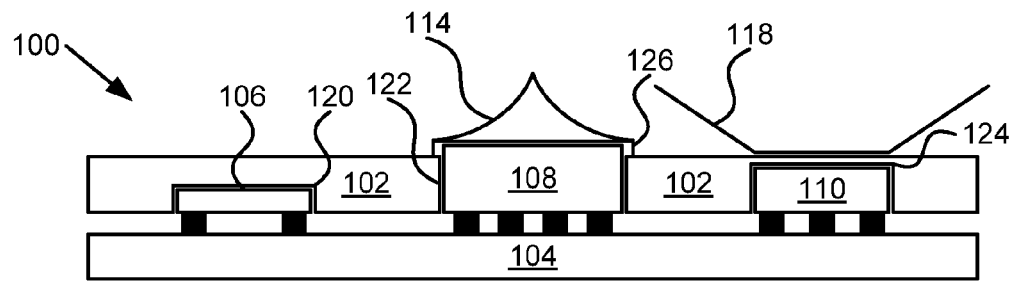
FIG. 1B is a schematic block diagram illustrating a section view of another embodiment of a solder apparatus in accordance with one embodiment of the present invention.

FIG. 1A is a schematic block diagram illustrating a section view of one embodiment of a solder apparatus 100 and FIG. 1B is a schematic block diagram illustrating a section view of another embodiment of the solder apparatus 100, in accordance with one embodiment of the present invention. The solder apparatus 100 includes a top plate 102 sized to cover a plurality of components 106, 108, 110 for a printed circuit board ("PCB") 104. The solder apparatus 100 is for use in a solder operation and may be used in a reflow solder operation to attach the components 106, 108, 110 to the PCB 104. While three components 106, 108, 110, one of skill in the art will recognize that the PCB 104 may include more components. Typically a PCB 104 is oriented horizontally in a solder operation, such as a solder reflow operation, and components 106, 108, 110 are placed on top of the PCB 104 and the PCB 104 with components 106, 108, 110 is heated so that solder reaches a liquid state and connects the component 106, 108, 110 to the PCB 104.

In one embodiment, the solder operation includes a conveyor that transports the PCB 104 and components 106, 108, 110 through a heated space or a device that directs heat toward the PCB 104. For example, in a solder reflow operation, solder is installed on the PCB 104 and/or on the components 106, 108, 110 and when the solder reaches a particular temperature, the solder transitions to a liquid state and the solder adheres to both the PCB 104 and components 106, 108, 110 so that solder joints are formed when the solder cools. In another embodiment, the solder operation includes placement of the PCB 104 and components 106, 108, 110 in a static oven. One of skill in the art will recognize other solder operations where components 106, 108, 110 are placed on a PCB 104 prior to soldering.

The solder apparatus 100 is configured to reduce heating of some components and may also increase heating to other components. For example, some components may be damaged during a reflow or other solder operation where a certain amount of heating is used to achieve a proper temperature for the solder so that the solder flows properly to bond the components to the PCB 104. In another example, a component may require more heat than would otherwise be available using standard soldering techniques in order to get solder under the component to flow for proper connection of the component to the PCB. The solder apparatus 100 includes heat shielding devices 112, 114 and/or heat attracting devices 116, 118 to adjust heat flow to various components 108, 110 during a solder operation.

The top plate 102 typically includes recesses 120, 122, 124 for various components 106, 108, 110. In one embodiment, the recesses 120, 122, 124 are sized with a depth so that a bottom of each of the components 106, 108, 110 to be soldered to the PCB 104 is parallel to the top surface of the PCB 104. As depicted in FIGS. 1A and 1B, each component 106, 108, 110 has a different height and the recesses 120, 122, 124 have different depths to accommodate the varying sizes of the components 106, 108, 110 so that all of the components 106, 108, 110 protrude a same distance from the top plate 102 and contact the PCB 104 evenly. Where the PCB 104 varies in height, for example due to a solder pad that is higher than other solder pads, the recesses 120, 122, 124 may be adjusted accordingly.

As depicted in FIGS. 1A and 1B, in some embodiments some components, such as the component 108 in the middle, may protrude through the top plate 102. In other embodiments, some components, such as the components 106, 110 on the right and left do not protrude through the top plate 102. The top plate 102 may include some components, e.g. component 108, that protrudes through the top plate 102 while other components, e.g. 106, 110, do not protrude through the top plate 102 and have a portion of the top plate 102 covering the components 106, 110.

In one embodiment, the solder apparatus 100 includes one or more heat shielding devices 112, 114, where each heat shielding device 112, 114 reduces heat transfer to a component 108 to be soldered to the PCB 104 during the solder operation and each heat shielding device 112, 114 is positioned in the top plate 102 to decrease heat to the component 108 corresponding to the heat shielding device 112, 114. In the example of FIG. 1A, the heat shielding device 112 may include a material that reduces heat flow to the component 108 under the heat shielding device 112. For example, the heat shielding device 112 may include a material that has a reduced heat flow with respect to air, the top plate 102, or other medium through which heat is transferred to the component 108. The material of the heat shielding device 112, in various examples, may include epoxy glass, a glass fiber material with an epoxy base, such as Durostone®, a glass-silicone laminate, such as G-7™, etc. Other materials for the heat shielding device 112 may include an aluminum plate with a polyimide film, such as Kapton®, meta-aramid materials, such as Nomex®, and the like. Covering a component 108 with a heat shielding device 112 that includes a material that resists heat transfer may decrease heat flow to the component 108 during a solder operation.

In another embodiment, as depicted in FIG. 1B, a heat shielding device 114 may include a shape that may direct heat away from a component 108. For example, the heat shielding device 114 may include vanes, fins, air directors, or other structures that may direct heat away from the component 108. In the example depicted, air/heat flow in a downward direction toward the component 108 may be directed horizontally away from the component 108 to reduce heat flow to the component 108 during a solder operation. In another embodiment, the heat shielding device 114 may include a structure designed to redirect air/heat away from a component 108 and may also include a material, as described above, that has a reduced heat flow through the material. For example, the structure of the heat shielding device 114 depicted in FIG. 1B may be made of G-7™, Kapton®, Nomex®, etc.

In one embodiment, the apparatus 100 includes one or more heat attracting devices 116, 118. Each heat attracting device 116, 118 increases heat transfer to a component (e.g. 110) to be soldered to the PCB 104 during the solder operation and each heat attracting device 116, 118 is positioned in the top plate 102 to increase heat to the component (e.g. 110) corresponding to the heat attracting device 116, 118. For example, the apparatus 100 may include a heat attracting device 116 that includes a material that transmits heat at an increased rate compared to other devices that do not include a heat attracting device 116. The heat attracting device 116, for example, may include a material that conducts heat through the heat attracting device 116 at a rate higher than heat transfer through material of the top plate 102. For example, the heat attracting device 116 may include a material such as copper while the top plate 102 may be made of aluminum where copper has a higher thermal conductivity than aluminum.

In another embodiment, the heat attracting device 118 is a device shaped to direct heat to an area under the heat attracting device 118. For example, the heat attracting device may include fins, vanes, etc. that may direct more heat toward an area under the heat attracting device 118, for example a base, than for an area without a heat attracting device 118. In the embodiment depicted in FIG. 1B, a heat attracting device 118 includes a shape that may funnel heated air from a soldering operation to the area under the heat attracting device and over a component 110. In other embodiments, the heat attracting device 118 may have fins, for example like a heat sink, or some other shape known to those of skill in the art that may direct more heat to a component 110 under the heat attracting device 118 than other components without a heat attracting device 118. In another embodiment, the heat attracting device 118 includes a material that efficiently transfers heat as well as a shape that directs more heat to an area under a base of the heat attracting device 118.

The component 108 in FIGS. 1A and 1B with a heat shielding device 112, 114 is shown protruding through the top plate 102. A component 108 that protrudes through the top plate 102 may have a heat shielding device 112, 114 or a heat attracting device 116, 118 over the component 108 or may not have any a heat shielding device 112, 114 or heat attracting device 116, 118 over the component 108. In one embodiment, a heat shielding device 112, 114 or heat attracting device 116, 118 may attach to the top plate 102, for example with some type of extension 126 as depicted in FIGS. 1A and 1B. In other embodiments, the heat shielding device 112, 114/heat attracting device 116, 118 may mount flush to the top plate 102, may connect to the top plate 102 at specific points, may connect to the top plate 102 with a continuous connection, or other method known to those of skill in the art.

In another embodiment, a component 106, 110 may fit in a recess 120, 124 that does protrude through the top plate 102. In one embodiment, a heat shielding device 112, 114/heat attracting device 116, 118 may be attached to the top plate 102 along a portion of the top plate 102 that runs above the component 110. In one embodiment, the portion of the top plate 102 above the component 110 is configured to allow the heat shielding device 112, 114/heat attracting device 116, 118 to function. For example, the portion of the top plate 102 above the component 110 may be relatively thin or may include a material that permits heat flow more readily than the surrounding top plate 102. One of skill in the art will recognize other ways that the top plate 102 may be configured to accommodate components 106, 108, 110 of varying heights and thermal requirements.

In one embodiment, one or more components 106 are recessed into the top plate 102 but do not have a heat shielding device 112, 114 or a heat attracting device 116, 118 over the component 106. For example, a component 106 may have a thermal requirement that is compatible with not having a heat shielding device 112, 114 or a heat attracting device 116. In one embodiment, the component 106 without a heat shielding/attracting device does not protrude through the top plate 102. In another embodiment, the component 106 protrudes through the top plate 102. For example, the apparatus 100 may accommodate numerous components (e.g. 106) that do not have a heat shielding device 112, 114 or a heat attracting device 116 while selected components (e.g. 108, 110) include heat shielding device 112, 114 or a heat attracting device 116. The apparatus 100 may be designed with specific component heating requirements in mind and may include some accommodations for heat sensitive components that require heat shielding or other components that require additional heating.

Figure 2:
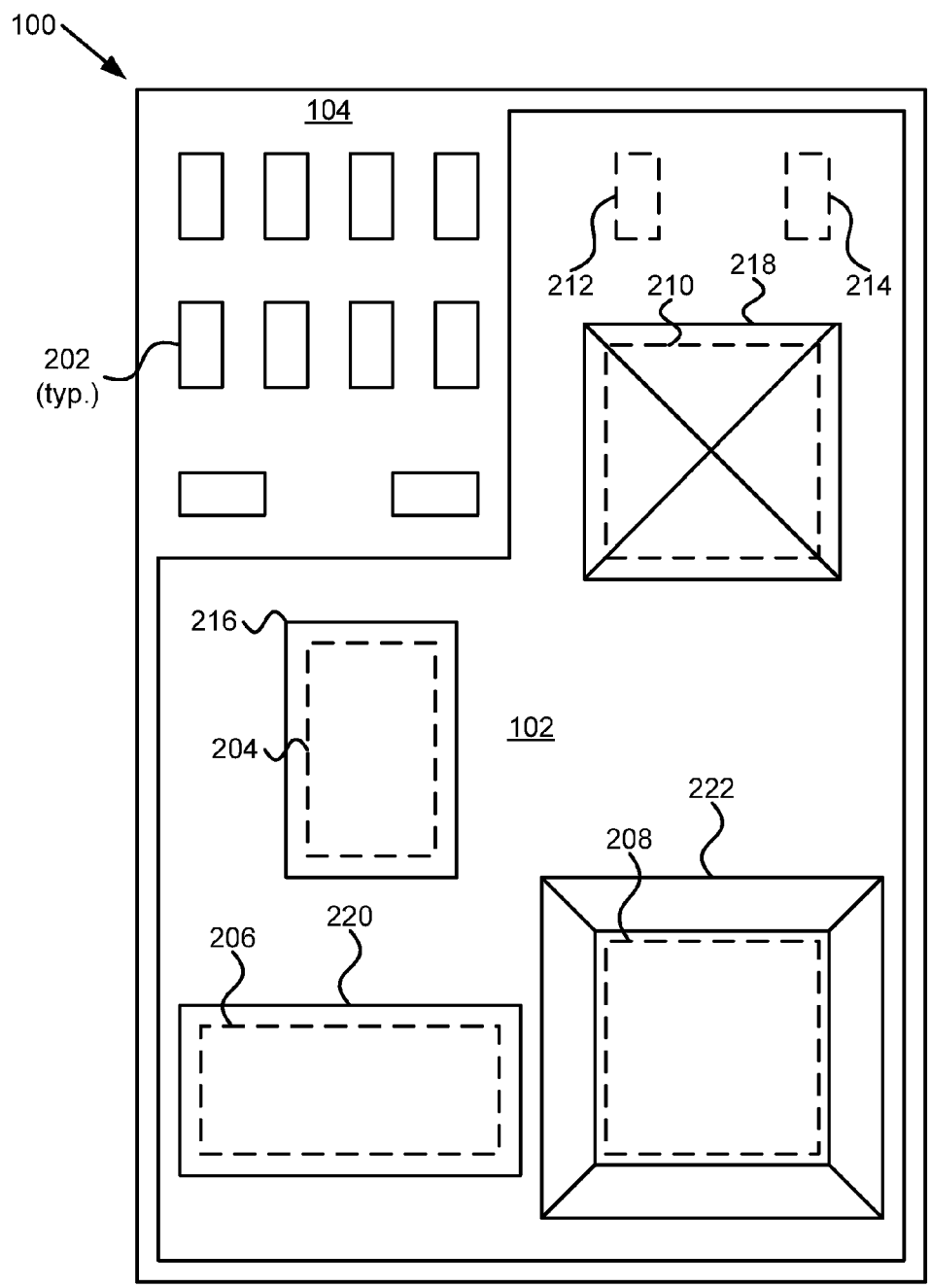
FIG. 2 is a schematic block diagram illustrating a plan view of one embodiment of a solder apparatus in accordance with one embodiment of the present invention.
Figure 3:
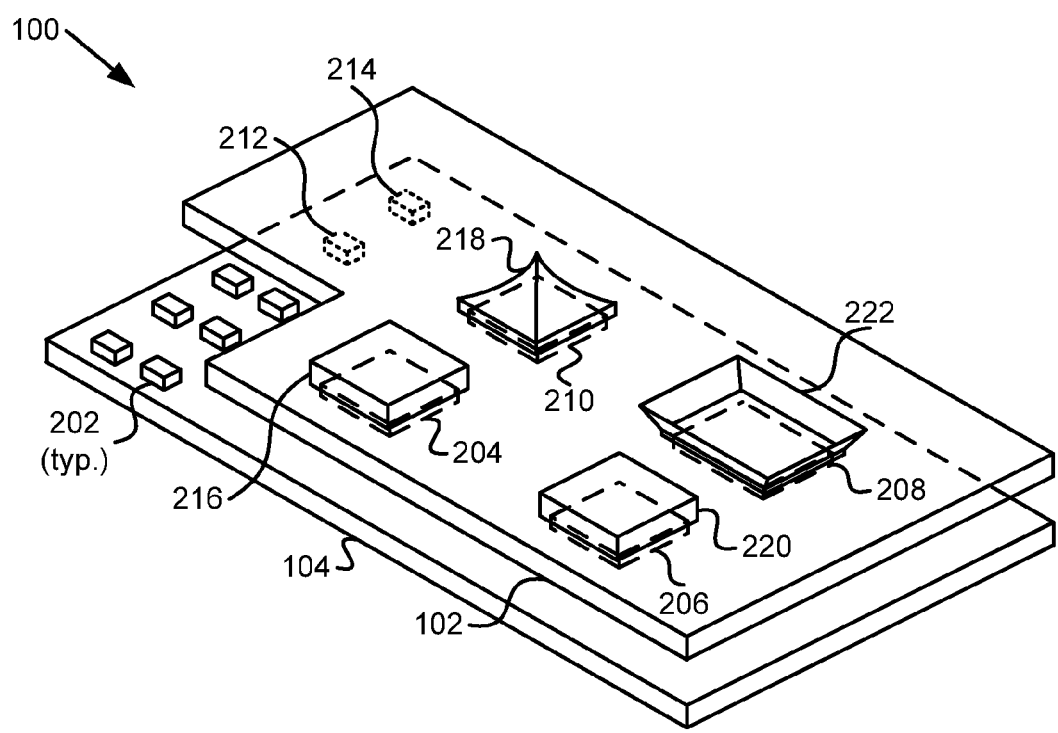
FIG. 3 is a schematic block diagram illustrating a perspective view of the embodiment of the solder apparatus depicted in FIG. 2.

FIG. 2 is a schematic block diagram illustrating a plan view of one embodiment of a solder apparatus 100 in accordance with one embodiment of the present invention. FIG. 3 is a schematic block diagram illustrating a perspective view of the embodiment of the solder apparatus 100 depicted in FIG. 2. FIGS. 2 and 3 depict one embodiment of a top plate 102 over a PCB 104. In the embodiment, the top plate 102 includes an opening positioned in the top left corner over one or more components 202. The opening is configured without a heat shielding device and without a heat attracting device. The opening in the top plate 102 also does not cover the components 202. Other embodiments may include other openings in the top plate 102 where the opening may or may not expose components. An opening in the top plate 102 may be useful to allow some components (e.g. 202) to be free from the top plate 102 and other heat shielding or heat attracting devices. For example, the components 202 in the area of the opening may be robust components that may withstand heat directly from a heat source in a soldering process. The opening, in one embodiment, may allow placement of the components 202 in the opening without having to place the components 202 in recesses 120, 122, 124 in the top plate 102. In one embodiment, the top plate 102 includes a large number of openings. For example, the top plate 102 may include a framework that connects recesses for components, such as a series of wires, rods, or other material sufficient to support recesses for components.

In the embodiment depicted in FIGS. 2 and 3, the solder apparatus 100 includes several components 204, 206, 208, 210 212, 214 under the area of the top plate 102. Some components 204, 210 may be covered by a heat shielding device 216, 218. Some components 206, 208 may be covered by a heat attracting device 220, 222 while some components 212, 214 may not include a heat shielding/attracting device but may be under the top plate 102. In the embodiment depicted in FIGS. 2 and 3, some heat shielding devices, such as the heat shielding device 216 over the component 204 in the center left portion of the top plate 102 may be made of a material that helps deflect heat, such as the heat shielding device 112 described above in relation to FIG. 1A over component 108.

Also in the embodiment depicted in FIGS. 2 and 3, some heat shielding devices, such as the heat shielding device 218 over the component 210 in the upper right portion of the top plate 102 may be made of a shape that helps deflect heat, such as the heat shielding device 114 described above in relation to FIG. 1B over component 108. For example, the heat shielding device 218, 114 may include a high point toward the middle of the heat shielding device 218, 114 and sides that slope in a way to direct heat and air flow away from the component 108, 210 under the heat shielding device 218, 114. Other shapes of a heat shielding device may also direct heat away from a component under the heat shielding device.

As depicted in FIGS. 2 and 3, some components (e.g. 206) may be covered by a heat attracting device 220 that has a material that allows heat transfer to a component 206 under the heat attracting device 220 at a higher rate than components (e.g. 204, 210, 212, 214) without a heat attracting device 220. The heat attracting device 220 is substantially similar to the heat attracting device 116 described in relation to FIG. 1A over component 110.

Also as depicted in FIGS. 2 and 3, some components (e.g. 208) may be covered by a heat attracting device 222 shaped to direct heat to a component 208 under the heat attracting device 222. The heat attracting device 22 in FIGS. 2 and 3 may be similar in design to the heat attracting device 118 in FIG. 1B and may have vanes forming in a funnel shape to direct heat toward a component 110, 208 under the heat attracting device 118, 222. Other shapes may also be used to direct heat toward a component and one of skill in the art will recognize other designs of a heat attracting device that direct heat to a component under the heat attracting device.

Also depicted in the embodiment of FIGS. 2 and 3 are components 212, 214 without a heat shielding device 216, 218 or a heat attracting device 220, 222 and may be substantially similar to the component 106 on the left in FIGS. 11A and 1B. The components 204, 206, 208, 210, 212, 214 depicted under the top plate 102, in one embodiment, each fit in a recess in the top plate 102. Note that the component layout depicted in FIGS. 2 and 3 differ from the component layout in FIGS. 1A and 1B merely for convenience.

Figure 4:
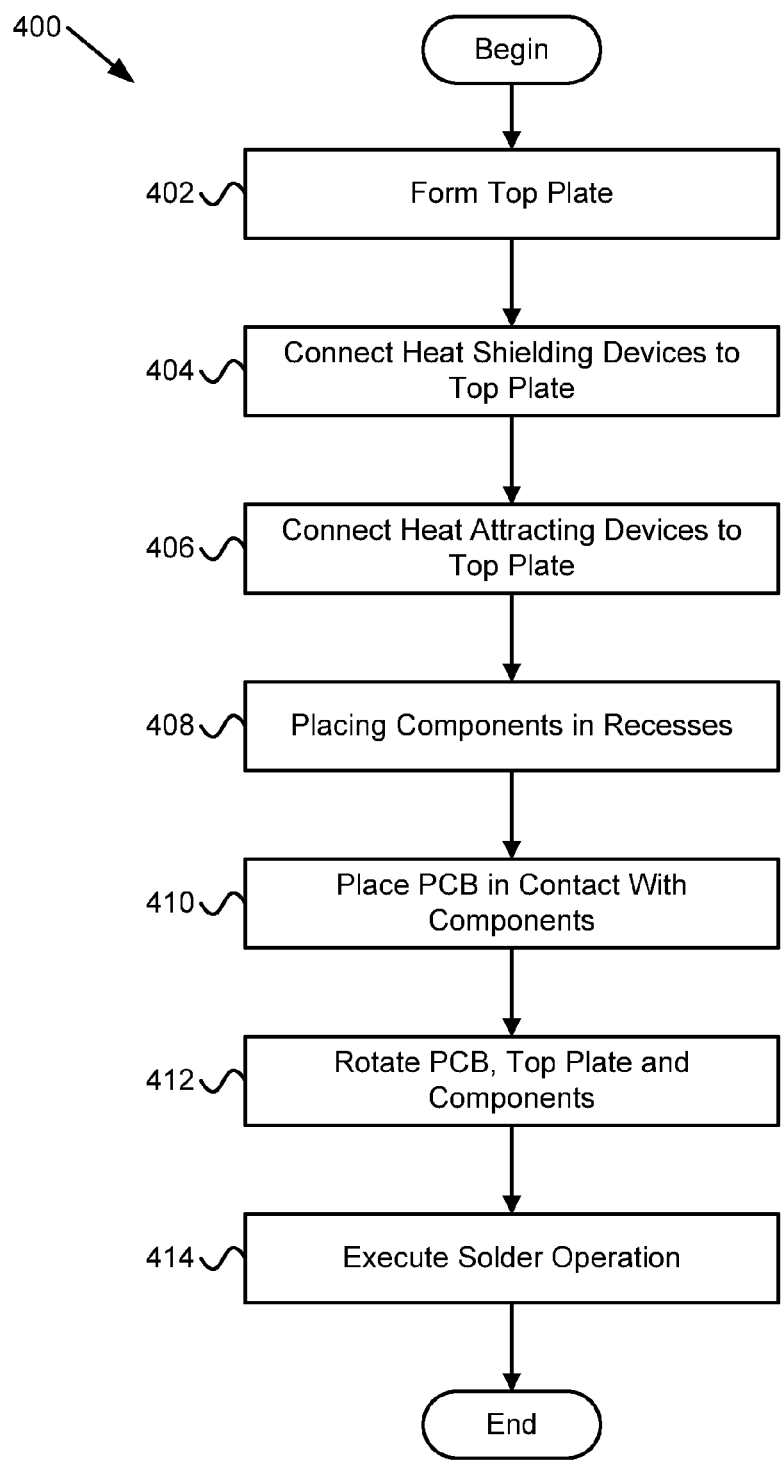
FIG. 4 is a schematic flow chart diagram illustrating one embodiment of a method for a solder apparatus in accordance with one embodiment of the present invention.

FIG. 4 is a schematic flow chart diagram illustrating one embodiment of a method 400 for a solder apparatus in accordance with one embodiment of the present invention. The solder apparatus may be substantially similar to the solder apparatus 100 depicted in FIGS. 1A, 1B, 2 and 3. The method 400 begins and forms 402 a top plate 102 sized to cover a plurality of components (e.g. 106, 108, 110, 204, 206, 208, 210, 212, 214) to be soldered to a PCB 104 in a solder operation to attach the plurality of components 106, 108, 110, 204, 206, 208, 210, 212, 214 to a top surface of the PCB 104.

The method 400, in one embodiment, connects 404 one or more a heat shielding devices (e.g. 112, 114, 216, 218) to the top plate 102. Each heat shielding device 112, 114, 216, 218 reduces heat transfer to a component (e.g. 108, 204, 210) to be soldered to the PCB 104 during the solder operation and each heat shielding device 112, 114, 216, 218 is positioned in the top plate 102 to decrease heat to the component 108, 204, 210 corresponding to the heat shielding device 112, 114, 216, 218. The method 400, in one embodiment, connects 406 one or more heat attracting devices (e.g. 116, 118, 220, 222) to the top plate 102. Each heat attracting device 116, 118, 220, 222 increases heat transfer to a component (e.g. 110, 206, 208) to be soldered to the PCB 104 during the solder operation and each heat attracting device 116, 118, 220, 222 is positioned in the top plate 102 to increase heat to the component 110, 206, 208 corresponding to the heat attracting device 116, 118, 220, 222. The top plate 102 may include only heat shielding devices, only heat attracting devices, or may have a combination of heat shielding and heat attracting devices.

In one embodiment, the top plate 102 includes a recess (e.g. 122, 124) for at least each component (e.g. 108, 110, 204, 206, 208, 210) configured with a heat shielding device (e.g. 112, 114, 216, 218) or a heat attracting device (e.g. 116, 118, 220, 222) and may include a recess (e.g. 120) for components (e.g. 106, 212, 214) without a heat shielding device or a heat attracting device. The method 400, in one embodiment, places 408 components (e.g. 106, 108, 204, 206, 208, 210) in recesses (e.g. 120, 122, 124). Each component is placed in the top plate 102 with a side to be soldered to the PCB 104 facing away from the top plate 102. The method 400 places 410 the PCB 104 in contact with the components with a top side of the PCB 104 facing the components.

In one embodiment, components are placed 408 in recesses in the top plate 102 while the top plate 102 is upside down with the recesses facing up. In the embodiment, the method 400 rotates 412 the PCB 104, top plate 102, and components and executes 414 the solder operation, and the method 400 ends. In another embodiment, the method 400 does not need to rotate 412 the PCB 104, top plate 12, and components, but places 408 components in the recesses in the top plate 102 while the top plate 102 is positioned with the recesses facing down. For example, the components may be placed first on the PCB 104 and the top plate 102 is placed over the PCB 104 so the components fit in the recesses. In another embodiment, the top plate 102 is positioned with the recesses facing downward and the components may adhere to the recesses when the components are placed 408 in the recesses. In one embodiment where the top plate 102 includes an opening where components (e.g. 202) are not covered by the top plate 102, prior to execution 414 of the solder operation, the method 400 places (not shown) additional components on the PCB 104.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a top plate comprising a top side and a bottom side, the bottom side oriented toward a printed circuit board ("PCB") in a reflow solder operation to attach a plurality of components to a top surface of the PCB;
a plurality of recesses within the top plate, each recess comprising an opening in the bottom of the top plate, each recess sized to maintain a component of the plurality of components in an orientation for soldering to the PCB, the plurality of recesses positioned within the top plate to maintain each of the plurality of components on the PCB in a correct location for soldering to the PCB during the reflow solder operation; and
one or more heat deflecting devices, each heat deflecting device comprising one of
a heat shielding device connected to the top plate and positioned over a recess of a component of the plurality of components and positioned on the top side of the top plate, each heat shielding device shaped to redirect heat flow directed toward a portion of the top side of the top plate above the recess of the component under the heat shielding device to a direction away from the recess of the component under the heat shielding device, each heat shielding device comprising a shape with a top portion that is narrower than a bottom portion nearest to the top plate; and
a heat attracting device connected to the top plate and positioned to be centered about a recess of a component of the plurality of components and on the top side of the top plate, the heat attracting device shaped to redirect heat flow directed toward a portion of the top side of the top plate surrounding the recess of the component centered under the heat attracting device to a direction toward the recess of the component centered under the heat attracting device, each heat shielding device comprising a shape with a top portion that is wider than a bottom portion nearest to the top plate.

2. The apparatus of claim 1, wherein each recess is sized with a depth so that a bottom of each of the plurality of components to be soldered to the PCB is parallel to the top surface of the PCB.

3. The apparatus of claim 1, wherein at least one recess in the top plate for a component extends through the top plate forming a hole in the top plate.

4. The apparatus of claim 3, wherein one of a heat shielding device and a heat attracting device is coupled to the top plate over the hole.

5. The apparatus of claim 3, wherein one of a heat shielding device and a heat attracting device contacts the component protruding through the top plate.

6. The apparatus of claim 1, wherein at least one recess in the top plate for a component extends partially through the top plate where a portion of the top plate extends over the component.

7. The apparatus of claim 6, wherein one of a heat shielding device and a heat attracting device is coupled to the top plate over the recess to the portion of the top plate extending over the component.

8. The apparatus of claim 1, wherein a heat shielding device comprises a heat resistant material that resists heat transfer through the heat shielding device.

9. The apparatus of claim 1, wherein a heat attracting device comprises a material that conducts heat through the heat attracting device at a rate higher than heat transfer through material of the top plate.

10. The apparatus of claim 1, wherein the top plate comprises at least one opening positioned over one or more additional components, the opening configured without a heat shielding device and without a heat attracting device.

11. The apparatus of claim 10, wherein the opening is configured to allow access to an area of the PCB for placement of the additional components on the PCB prior to the reflow solder operation.

12. The apparatus of claim 1, wherein the top plate comprises one or more recesses for components without a heat shielding device and without a heat attracting device.

13. The apparatus of claim 1, wherein the top plate comprises a plurality of openings surrounding the recesses for the plurality of components.

14. The apparatus of claim 1, wherein the top plate comprises aluminum.

15. A method, comprising:
forming a top plate comprising a top side and a bottom side, the bottom side oriented toward a printed circuit board ("PCB") in a reflow solder operation to attach a plurality of components to a top surface of the PCB, the top plate comprising a plurality of recesses within the top plate, each recess comprising an opening in the bottom of the top plate, each recess sized to maintain a component of the plurality of components in an orientation for soldering to the PCB, the plurality of recesses positioned within the top plate to maintain each of the plurality of components on the PCB in a correct location for soldering to the PCB during the reflow solder operation;

connecting the top plate to one or more heat deflecting devices, each heat deflecting device comprising one of a heat shielding device connected to the top plate and positioned over a recess of a component of the plurality of components and positioned on the top side of the top plate, each heat shielding device shaped to redirect heat flow directed toward a portion of the top side of the top plate above the recess of the component under the heat shielding device to a direction away from the recess of the component under the heat shielding device, each heat shielding device comprising a shape with a top portion that is narrower than a bottom portion nearest to the top plate; and a heat attracting device connected to the top plate and positioned to be centered about a recess of a component of the plurality of components and on the top side of the top plate, the heat attracting device shaped to redirect heat flow directed toward a portion of the top side of the top plate surrounding the recess of the component centered under the heat attracting device to a direction toward the recess of the component centered under the heat attracting device, each heat shielding device comprising a shape with a top portion that is wider than a bottom portion nearest to the top plate;

placing the plurality of components in the recesses, wherein each component of the plurality of components is placed in the top plate with a side to be soldered to the PCB facing away from the top plate;

placing the PCB in contact with the plurality of components with a top side of the PCB facing the components; and executing the reflow solder operation.

16. The method of claim 15, wherein the plurality of components are placed in the top plate while the top plate is positioned with the recesses facing up and further comprising, prior to executing the reflow solder operation, rotating the top plate, components, and PCB so the PCB is below the top plate.

17. The method of claim 16, further comprising placing one or more additional components on the PCB through an opening in the PCB in response to rotating the top plate, components, and PCB and prior to executing the reflow solder operation.

18. A soldering apparatus comprising:

a top plate comprising a top side and a bottom side, the bottom side oriented toward a printed circuit board ("PCB") in a reflow solder operation to attach a plurality of components to a top surface of the PCB, the top plate comprising at least one opening positioned over one or more additional components;

a plurality of recesses within the top plate, each recess comprising an opening in the bottom of the top plate, each recess sized to maintain a component of the plurality of components in an orientation for soldering to the PCB, the plurality of recesses positioned within the top plate to maintain each of the plurality of components on the PCB in a correct location for soldering to the PCB during the reflow solder operation; and one or more heat deflecting devices, each heat deflecting device comprising one of a heat shielding device connected to the top plate and positioned over a recess of a component of the plurality of components and positioned on the top side of the top plate, each heat shielding device shaped to redirect heat flow directed toward a portion of the top side of the top plate above the recess of the component under the heat shielding device to a direction away from the recess of the component under the heat shielding device, each heat shielding device comprising a shape with a top portion that is narrower than a bottom portion nearest to the top plate; and a heat attracting device connected to the top plate and positioned to be centered about a recess of a component of the plurality of components and on the top side of the top plate, the heat attracting device shaped to redirect heat flow directed toward a portion of the top side of the top plate surrounding the recess of the component centered under the heat attracting device to a direction toward the recess of the component centered under the heat attracting device, each heat shielding device comprising a shape with a top portion that is wider than a bottom portion nearest to the top plate, wherein at least one recess in the top plate for a component of the plurality of components extends partially through the top plate where a portion of the top plate extends over the component wherein one of a heat shielding device and a heat attracting device is coupled to the top plate over the recess to the portion of the top plate extending over the component, wherein the at least one opening in the top plate over the one or more additional components is configured without a heat shielding device and without a heat attracting device and the at least one opening over the one or more additional components is configured to allow access to an area of the PCB for placement of the additional components on the PCB prior to the reflow solder operation, wherein each recess is sized with a depth so that a bottom of each of the plurality of components to be soldered to the PCB is parallel to the top surface of the PCB.

* * * * *